US00RE39051E

(19) United States
(12) Reissued Patent
Harnett

(10) Patent Number: US RE39,051 E
(45) Date of Reissued Patent: Mar. 28, 2006

(54) FUZZY LOGIC TUNING OF RF MATCHING NETWORK

(75) Inventor: Sean Harnett, Penfield, NY (US)

(73) Assignee: ENI Technology, Inc., Rochester, NY (US)

(21) Appl. No.: 09/712,596

(22) Filed: Nov. 14, 2000

Related U.S. Patent Documents

Reissue of:
(64) Patent No.: 5,842,154
Issued: Nov. 24, 1998
Appl. No.: 08/929,870
Filed: Sep. 15, 1997

(51) Int. Cl.
*H01P 5/08* (2006.01)

(52) U.S. Cl. ..... 702/106; 333/17.3; 706/8
(58) Field of Classification Search ..... 702/106, 702/107, 85, 57, 65, 72, 71, 189, 75; 333/17.1–17.3, 333/32; 334/11, 12, 14, 71; 343/861–864; 455/123, 125; 324/629, 630, 632, 638, 642; 706/1, 3–5, 7, 8, 900, 903, 908, 909, 911, 706/916, 917; 700/47, 50
See application file for complete search history.

(56) References Cited

U.S. PATENT DOCUMENTS 4,375,051 A * 2/1983 Theall ..... 333/17.3
4,485,360 A * 11/1984 Seward ..... 333/17.3
4,621,242 A * 11/1986 Theall, Jr. et al. ..... 333/32
4,864,490 A * 9/1989 Nomoto et al. ..... 700/37
4,951,009 A * 8/1990 Collins ..... 333/17.3
5,053,725 A * 10/1991 Gesche et al. ..... 333/17.3
5,187,454 A * 2/1993 Collins et al. ..... 333/17.3
5,195,045 A * 3/1993 Keane et al. ..... 364/482
5,424,691 A * 6/1995 Sadinsky ..... 333/17.3
5,497,063 A * 3/1996 Day et al. ..... 706/900
5,654,679 A * 8/1997 Mavretic et al. ..... 333/17.3
5,805,649 A * 9/1998 Travaglia et al. ..... 706/3
5,842,154 A 11/1998 Harnett ..... 702/106
5,889,252 A * 3/1999 Williams et al. ..... 333/17.3
5,982,099 A * 11/1999 Barnes et al. ..... 333/17.3

FOREIGN PATENT DOCUMENTS

DE 19521387 A1 * 12/1996

OTHER PUBLICATIONS

Bannatyne, Ross, Fuzzy Logic—A New Approach to Embedded Control Solutions, Motorola Ltd., East Kilbride, Scotland, 1992.*
Gesche et al., Translation of German Patent Document DE 195 21 387 A1, Dec. 19, 1996.*
Fuzzy Logic and the Neuron Chip, Motorola Semiconductor Technical Data, pp. AL–55–AL–73, (no date).
Bannatyne, Ross, "Fuzzy Logic—A new approach to Embedded Control Solutions", Semiconductor Design Concept, 1992, pp. 1–4, (no month).

* cited by examiner

*Primary Examiner*—Hal D Wachsman
(74) *Attorney, Agent, or Firm*—Harness, Dickey & Pierce, P.L.C.

(57) ABSTRACT

A fuzzy logic control arrangement is provided for an impedance match network of the type that is typically employed between a source of RF power at a given impedance, e.g., 50 ohms, and a non-linear load whose impedance can vary in magnitude and phase, e.g., an RF plasma. The fuzzy logic controller fuzzifies the phase and the magnitude error signals. The error signals are applied to a fuzzy logic interference function based on a number of fuzzy sets. The values of the error signals enjoy some degree of membership in one or more fuzzy sets. Fuzzy logic rules are applied to the phase and magnitude error signals. In a defuzzification stage, drive signal values are obtained for moving the tuning elements of the variable impedances. The drive signal values are weighted according to respective fuzzy inference functions for which the error signals enjoy membership. Then the weighted drive signal values are combined to produce output drive signals.

33 Claims, 5 Drawing Sheets

| MAGNITUDE \ PHASE | NL | NM | Ze | PM | PL |
|---|---|---|---|---|---|
| NL | PL | Ze | NM | NM | NL |
| NM | PL | Ze | NM | NL | NL |
| Ze | PL | PM | Ze | NM | NM |
| PM | PL | PM | PM | Ze | NM |
| PL | PL | PL | PM | Ze | NL |

$SC_1$ CURRENT

FIG.5A

| MAGNITUDE \ PHASE | NL | NM | Ze | PM | PL |
|---|---|---|---|---|---|
| NL | PL | PL | PL | Ze | NL |
| NM | PL | PM | PM | Ze | NL |
| Ze | PM | Ze | Ze | NM | NL |
| PM | Ze | NM | NM | NM | NL |
| PL | NL | NL | NL | NL | NL |

$SC_2$ CURRENT

FIG.5B

| MAGNITUDE \ PHASE | NL | NM | Ze | PM | PL |
|---|---|---|---|---|---|
| NL | PL | PM | Ze | NM | NL |
| NM | PL | PM | Ze | NM | NL |
| Ze | PL | PM | Ze | NM | NL |
| PM | PL | PM | Ze | NM | NL |
| PL | PL | PM | Ze | NM | NL |

$SC_1$ CURRENT

FIG.6A

| MAGNITUDE \ PHASE | NL | NM | Ze | PM | PL |
|---|---|---|---|---|---|
| NL | PL | PL | PL | PL | PL |
| NM | PM | PM | PM | PM | PM |
| Ze | Ze | Ze | Ze | Ze | Ze |
| PM | NM | NM | NM | NM | NM |
| PL | NL | NL | NL | NL | NL |

$SC_2$ CURRENT

FIG.6B

FUZZY LOGIC TUNING OF RF MATCHING NETWORK

Matter enclosed in heavy brackets [ ] appears in the original patent but forms no part of this reissue specification; matter printed in italics indicates the additions made by reissue.

BACKGROUND OF THE INVENTION

This invention relates to plasma generation equipment, and is particularly directed to an automatic RF matching network to match the impedance of a reactive plasma chamber or similar non-linear load to a constant impedance (e.g., 50 ohms) output of an RF generator or similar RF source. The invention is more particularly concerned with a fuzzy logic technique that is capable of controlling two, or more, tunable elements in the matching network using both the phase error signal and magnitude error signal associated with the matching network.

In a typical RF plasma generator arrangement, a high power RF source produces an RF wave at a preset frequency, i.e., 13.56 MHZ, and this is furnished along a power conduit to a plasma chamber. The RF power is also typically provided at a fixed, known impedance, e.g., 50 ohms. Because there is typically a severe impedance mismatch between the RF power source and the plasma chamber, an impedance matching network is interposed between the two. There are non-linearities in the plasma chamber which make it difficult to simply set the impedance match network at fixed positions for a plasma process. At the input to the matching network there is located a phase and magnitude error detector that produces two (or more) error signals representing the magnitude of impedance error and phase error. Magnitude error is the difference between the magnitude of the nominal input impedance (typically 50Ω and the magnitude of the actual input impedance. Phase error is the deviation between the phase at the nominal input impedance (typically zero degrees) and the phase at the actual input impedance. The error signals also indicate the direction or sign (+ or −) of the magnitude error and phase error.

The conventional matching network uses these two error signals to control two variable tuning elements: phase error being used to control one tuning element and magnitude error being used to control the other tuning element. The phase and magnitude error signals drive motors associated with variable capacitors or perhaps a tuning slug of a variable inductor. The error signals drop to a low or zero level when a matched condition has been achieved.

The conventional system has experienced difficulty in quickly achieving matched impedance under a number of conditions. One primary problem is that the current design does not address the fact that each tuning element affects both error signals. Because of this effect, the error signals may drive one or both of the tuning elements away from the match or tune point. This prolongs the tuning process, and causes slower, less reliable tuning. Another problem arises because the phase and magnitude error signals alone do not always provide enough information to drive the matching network to the tune point. This means that the matching network may have "lost conditions" where it will be unable to reach impedance match. A third problem is that the error signal produced by a given movement of a tuning element varies with the tuning element's position. In other words, if the tuning element is near the minimum end of its travel, a 10% change in position may produce a 50% change in error signal amplitude, but if the tuning element is near the maximum end of its travel, the same 10% change might produce only a 5% change in error signal amplitude. This will cause the control loop stability to vary depending upon the position of the tuning elements. However, at the present time, no practical system even tracks the tuning element (e.g., rotor) position as an input.

A cross-point approach to address the first-mentioned problem has been proposed previously, but still uses only a single error signal for each of two tuning elements. Another problem is that this approach requires a hard, fixed threshold rather than a gradual transition.

A lost-recovery approach has been proposed to address the second problem mentioned above, namely the "lost conditions" problem. In this approach the system detects that impedance match has been lost, and then moves the tuning elements to predetermined "lost recovery" positions, from which it can tune to a match. This approach wastes considerable time in recovering impedance match, and may not work with every load in the tuning range.

The industry does not seem to have recognized the third problem arising from the non-linearity of the error signal across its range. Also, the desirability of using more than one error signal to control each tuning element has not been recognized, nor has any process been proposed for combining multiple error signals to control each of the tuning elements associated with the impedance matching network.

Fuzzy logic has been employed as a control algorithm in many applications, and has the advantage of reducing a complex multi-dimensional treatment to a rather straightforward algorithm based on a simple set of rules. Fuzzy logic is based on Fuzzy Set Theory, a branch of mathematics developed by Prof. Lofti A. Zadeh in the 1960's. Fuzzy logic provides a robust, non-linear and efficient approach to control by mapping inputs to outputs using a minimal amount of code. The basis for fuzzy logic and fuzzy controls has been explained in many places in the mathematical and engineering literature. Basically, the fuzzy logic control process can be described as a small number steps or stages. First, the process control engineer establishes a number of overlapping fuzzy sets, e.g., "high positive," "medium positive," "zero" or small, "medium negative," and "high negative." In the first stage, i.e., "fuzzification," crisp, discrete input values are fuzzified, that is, they are converted into appropriate degrees of membership in overlapping fuzzy sets. Then, in a rule application stage, rules are applied to define the relation between the input variables and the output variables. These rules are provided in terms of a "fuzzy interference function" and represent a relation that should be intuitive to the process engineer. These can be a series of IF-AND-THEN statements, or can be constructed as a straightforward table, grid or matrix. An output or defuzzification stage converts the fuzzy variables to crisp output values that are applied as control values or signals to a control device, such as the rotor of a variable capacitor.

No one has previously considered employing fuzzy logic to the control the tuning of an impedance match network, and no one has previously appreciated that an application of fuzzy logic would resolve the three problems mentioned above.

OBJECTS AND SUMMARY OF THE INVENTION

It is an object of this invention to provide the scheme for controlling the tuning of an RF matching network that avoids the drawbacks of the prior art.

It is another object of this invention to provide automatic tuning of an RF matching network that avoids problems of single variable control of the tuning elements, "lost conditions" and non-linearity across the tuning range.

It is a further object to provide automatic tuning of the RF matching network which is fast and reliable, and which is easily implemented and adjusted.

According to an aspect of this invention, a fuzzy logic method is employed for tuning an RF matching network of the type having an input at which is applied RF power at a given frequency and at a given impedance, and an output which applies such power to an RF load having a non-constant impedance, such as an RF plasma chamber. The matching network has a phase-magnitude error detector providing a phase error signal and a magnitude error signal related respectively to the differences between nominal and actual input phase angle, i.e., $\Delta\phi$ and between nominal and actual impedance $\Delta Z$. The matching network has at least a first variable impedance having a driven element for varying its impedance, and a second variable impedance having a driven element for varying its impedance. The fuzzy logic control technique involves the steps of supplying the phase and the magnitude error signals to a fuzzy logic controller, wherein each error signal has a magnitude and direction. Then the error signals are each applied to a fuzzy logic inference function based on membership in one or more fuzzy sets, which may be overlapping fuzzy sets. The value, i.e., the size and direction of each error signal enjoys membership in one, two, or more overlapping fuzzy sets. Fuzzy logic rules are applied to the phase and magnitude error signals according to the fuzzy sets for which said first and second error signals enjoy membership. A plurality of drive signal values are obtained, based on the fuzzy logic rules for each of the phase and magnitude error signals. The drive signal values are weighted according to respective fuzzy interference functions for which the error signals enjoy membership. Then the weighted drive signal values are combined to produce an output drive signal for the first variable impedance-device driven element. A similar process creates an output drive signal for the second variable impedance. According to the fuzzy logic rules, the phase and magnitude error signals are used jointly to obtain each of the output drive signals.

The fuzzy logic rules can be expressed as a matrix of N×M drive current values, where N is the number of fuzzy sets of said first error signal and M is the number of fuzzy sets of said second error signal. Here, to obtain each drive current value, there is a given set of rules applying the first error signal and the second error signal.

A fuzzy logic controller is provided according to another aspect of this invention for tuning an RF matching network, wherein the matching network is positioned between a source of applied RF power at a given frequency and at a given impedance, and an RF load, such as an RF plasma chamber, having a non-constant impedance. A phase-magnitude error detector produces a phase error signal and a magnitude error signal related respectively to the phase error and magnitude error in input impedance, as discussed earlier. The matching network also has at least a first variable impedance having a driven element for varying the impedance thereof and a second variable impedance having a driven element for varying the impedance thereof. The fuzzy logic controller has input means to receive the values of the phase and magnitude error signals. The controller applies these values of error signals to a fuzzy logic inference function based on a number of overlapping fuzzy sets. The values of error signals enjoy membership in one, two, or more overlapping fuzzy sets. Fuzzy logic rules are applied to the phase and magnitude error signals, with the rules depending on the fuzzy sets for which the error signals enjoy membership. Drive signal values are obtained according to the fuzzy logic rules for each fuzzy set for which the error signals enjoy membership. The drive signal values are weighted according to the respective fuzzy inference functions for the values of these error signals. Then the weighted drive signal values are combined to produce an output drive signal for the first variable impedance device driven element. Additional drive signal values are obtained based on additional fuzzy logic rules for each of the phase and magnitude error signals. Then these additional drive signal values are weighted according to additional respective fuzzy inference functions, and the weighted drive signal values are combined to produce an output drive signal for the second variable impedance device driven element.

The fuzzy logic controller quickly drives the turning elements to a matched impedance state, and avoids lost condition problems. The fuzzy logic controller can be implemented in hardware, or can be based on a programmed device such as a digital signal processor (DSP) or a microprocessor. The fuzzy logic controller function can operate in background, or can employ a separate hardware device to free the DSP for other functions such as signal processing, motor control, user interface, or other functions. A separate independent PC can be employed to carry out the fuzzy logic tuning.

Further enhancements in performance can be obtained by employing additional inputs. For example, tuning element positions can be used as inputs to linearize loop gain as a function of position. This can achieve higher overall loop gain and faster tuning speeds. A reduction or elimination of lost conditions can be achieved by using additional sensors, e.g., voltage and current at the RF plasma chamber, and then applying the detected levels as additional inputs to the fuzzy logic controller.

The improvements of this invention use fuzzy logic to provide a practical method to analyze multiple inputs and to produce signals which will drive multiple tuning elements. In a minimal system, the fuzzy controller inputs can consist of phase and magnitude errors, and the fuzzy outputs can consist of one or both of the drive signals for the tuning elements.

The invention can be easily extended to control of three or more variable tuning devices.

The above and many other objects, features, and advantages of this invention will become apparent from the ensuing description of a preferred embodiment, which is to be read in conjunction with the accompanying Drawing.

BRIEF DESCRIPTION OF THE DRAWING

FIGS. 5A and 5B are fuzzy logic rule application matrices for first and second variable impedance tuning drive signals according to an embodiment of this invention.

FIGS. 6A and 6B are fuzzy logic rule application matrices for first and second variable impedance tuning drive signals according to another embodiment of this invention.

DETAILED DESCRIPTION OF THE PREFERRED EMBODIMENT

Figure 1:
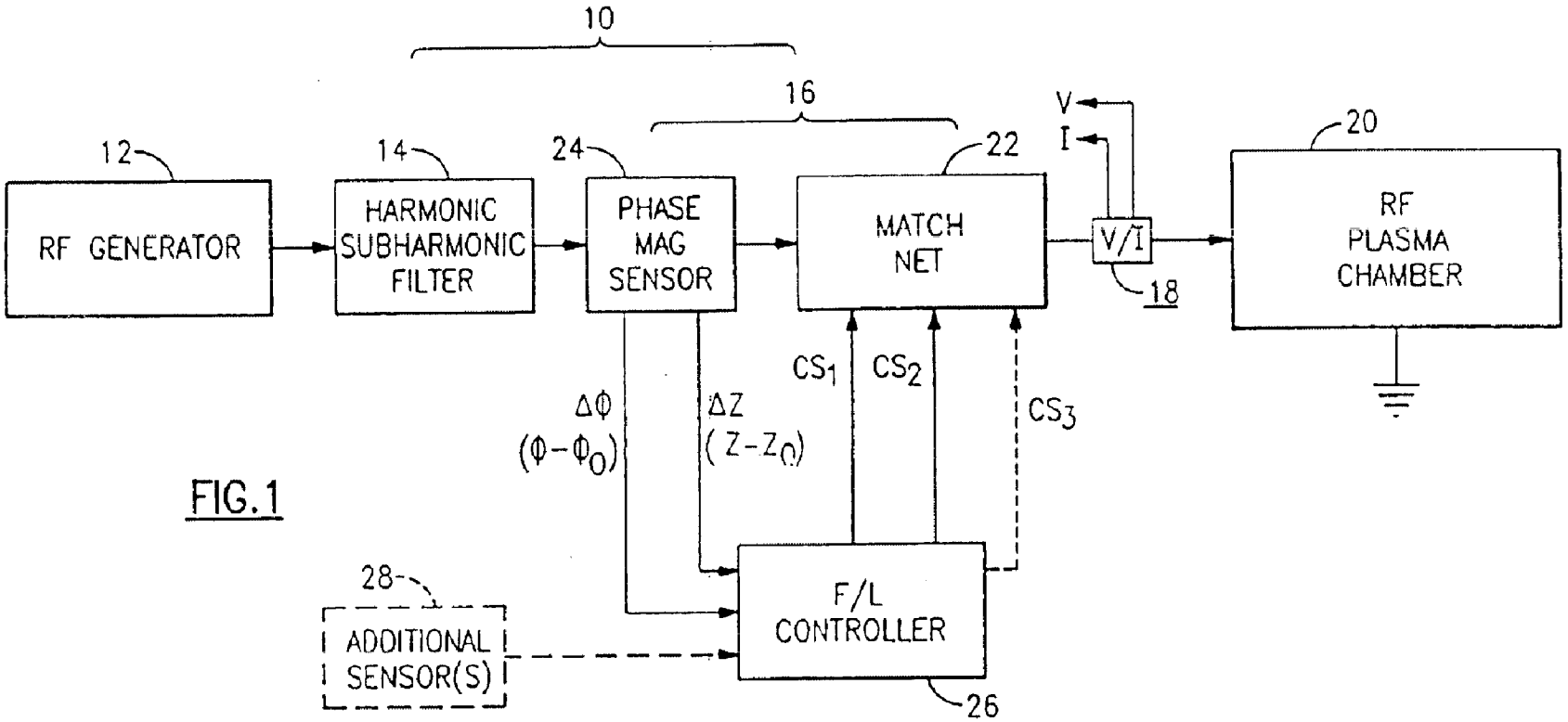
FIG. 1 is a system block diagram of an RF plasma process incorporating an impedance match net with a fuzzy logic control system according to one embodiment of this invention.

With reference to the Drawing figures, and initially to FIG. 1, an RF plasma processing system 10 is shown for purposes of example. A plasma generator 12 provides RF electrical power at a predetermined frequency, i.e., 13.56 MHz. The output of the generator 12 is followed by a harmonic/subharmonic filter 14, which is then followed by an impedance matching network 16, which supplies the electrical power through a voltage/current sensor system 18 to an input of a plasma chamber 20. The matching network 16 comprises a controllable impedance matching unit 22, with a phase/magnitude sensor 24 connected at its input. The sensor provides a phase error signal $\Delta\phi$ that is proportional to the difference between the nominal input impedance phase angle and the actual phase angle ($\phi-\phi_o$) of the impedance matching unit, and also provides a magnitude error signal $\Delta Z$ that is proportional to the difference between the nominal input impedance and actual input impedance ($Z-Z_o$).

A fuzzy logic controller 26 has inputs to receive the phase error signal $\Delta\phi$ and to receive the magnitude error signal $\Delta Z$, and respective control signal outputs CS1 and CS2 for controlling respective first and second variable impedance devices within the unit 22. An optional third control signal output CS3 is shown in ghost lines. Additional sensors 28 can optionally provide the fuzzy logic controller 26 with additional input signals, e.g., time rate of change of phase error. The fuzzy logic controller can be a separate unit, but may also be incorporated into the housing of the impedance matching network 16. The operating codes, including the fuzzy logic rule matrix and fuzzy logic inference function algorithm can be stored in a memory device (not shown) of the controller 26. This memory device can be a programmable read-only memory, such as an E-PROM, capable of storing downloaded program codes, and providing for revision of the codes to optimize the tuning of the matching network 16. It is also possible to employ a "fixed match" arrangement, and use the error signals $\Delta\phi$ and $\Delta Z$ to control the frequency of the plasma generator 12.

Figure 2:
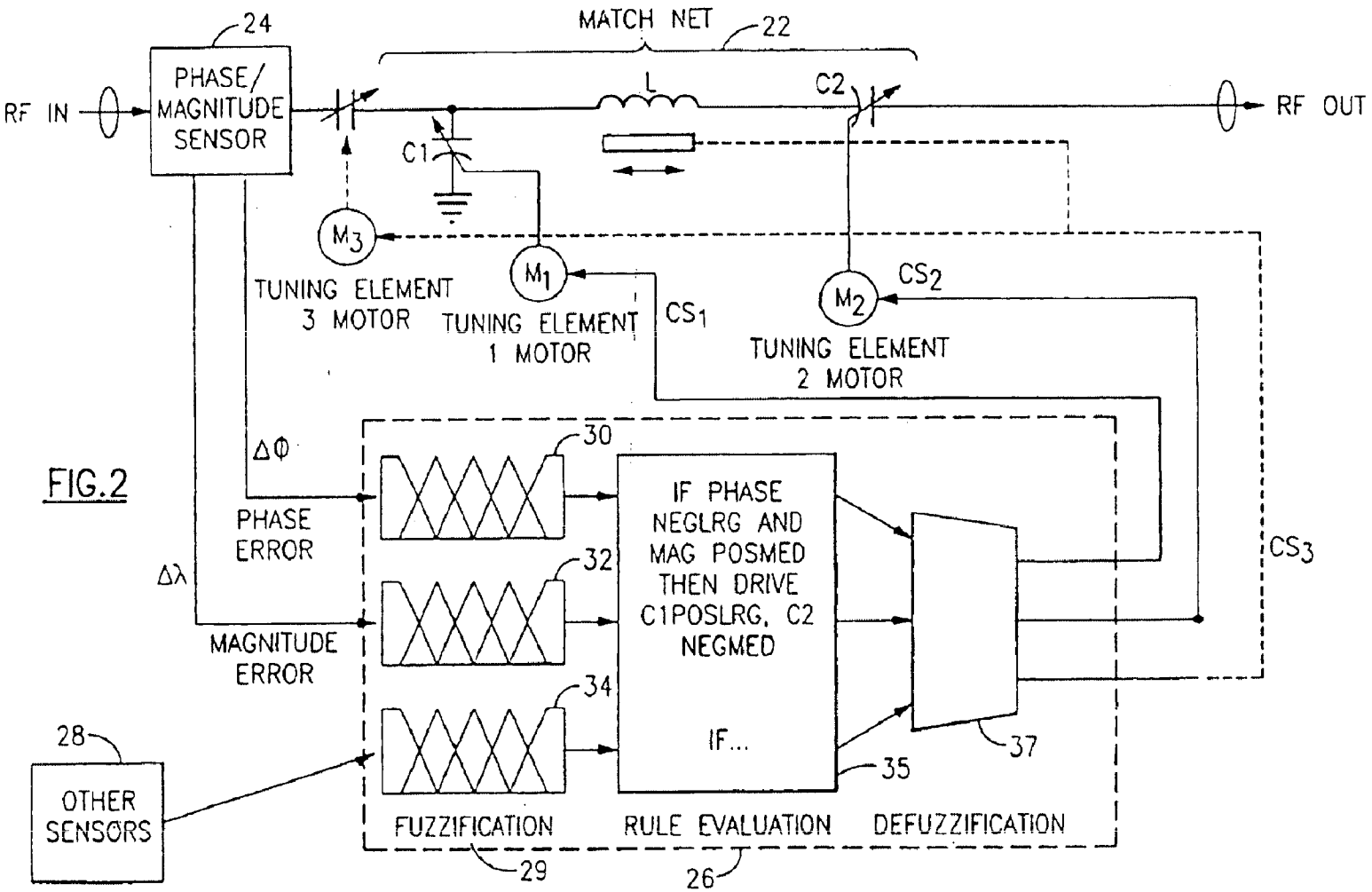
FIG. 2 is an enlarged schematic diagram of the match net and control system of this embodiment.

FIG. 2 shows details of the match net unit 22 and the fuzzy logic controller 26 from which the operation of this invention can be explained. The match net unit 22 includes a number of variable impedance devices for effecting tuning to establish an impedance match between the 50 ohms of the RF generator 12 and the unknown impedance of the RF plasma chamber 20. Besides the fixed impedances (not shown) there can be a first tuning capacitor C1 and a second capacitor C2. Optionally, there can also be a third tuning capacitor C3 and/or a tunable inductor L. The first and second tuning capacitors each have a tuning element motor M1 and M2, respectively. If additional tuning elements are desired, a third tuning element motor M3 can be provided for the third capacitor C3. Also, a motor (not shown) can be provided for the tuning slug of the tunable inductor L.

The fuzzy logic controller 26 here accomplishes three operations on the input signals, which are here shown as the phase error signal $\Delta\phi$, the impedance magnitude error signal $\Delta Z$, and any additional error signals, e.g., from other sensors 28. The error signals are first applied to a fuzzification stage 29, where the error signals are applied to respective fuzzy inference functions 30, 32, 34. These functions here are shown as sequences of overlapping triangular or trapezoidal ramp functions, and will be explained in detail shortly. Then, in a rule evaluation stage 35, predetermined rules are applied, depending on the fuzzy sets in the fuzzification stage 29 to which each of the error signals enjoys membership. These can be expressed as IF-AND-THEN logic statements, such as IF the phase error is negative and large, AND IF the magnitude error is positive and medium, THEN apply a positive large drive signal as CS1 and apply a negative medium drive signal as CS2. The rules for all combinations of fuzzy set memberships of phase error and magnitude error can be considered as a matrix of N×M rules, where N is the number of fuzzy sets of phase error and M is the number of fuzzy sets of magnitude error. The several drive signal values obtained in the rule elevation stage 35 are then converted to discrete drive signal values CS1, CS2, CS3, etc., in a defuzzification stage 37.

Figure 3:
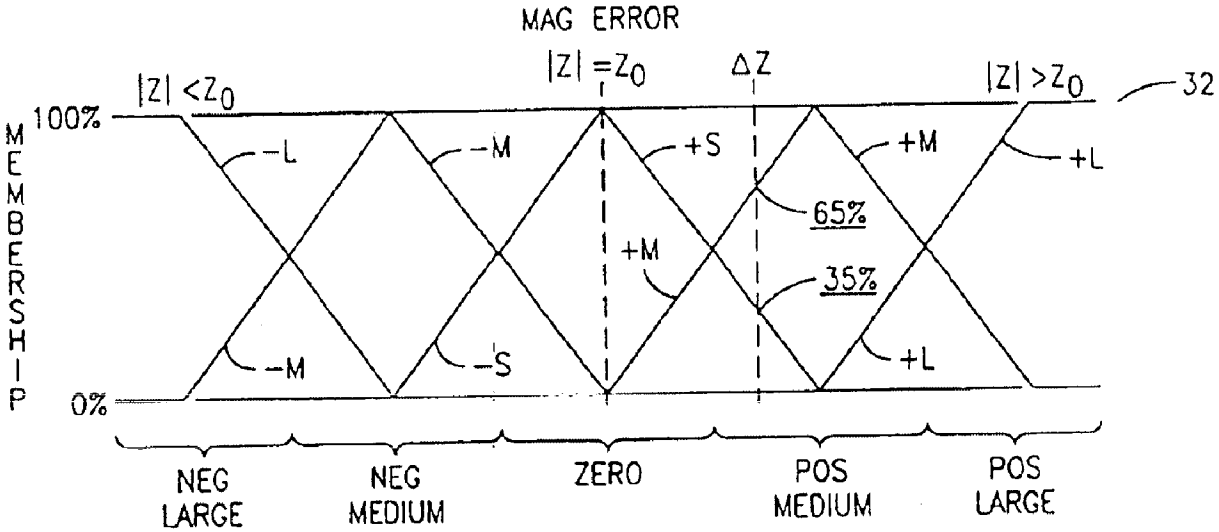
FIGS. 3 and 4 are charts of the fuzzy logic inference functions or membership functions with respect to the fuzzy sets of impedance magnitude error and phase angle error, respectively.
Figure 4:
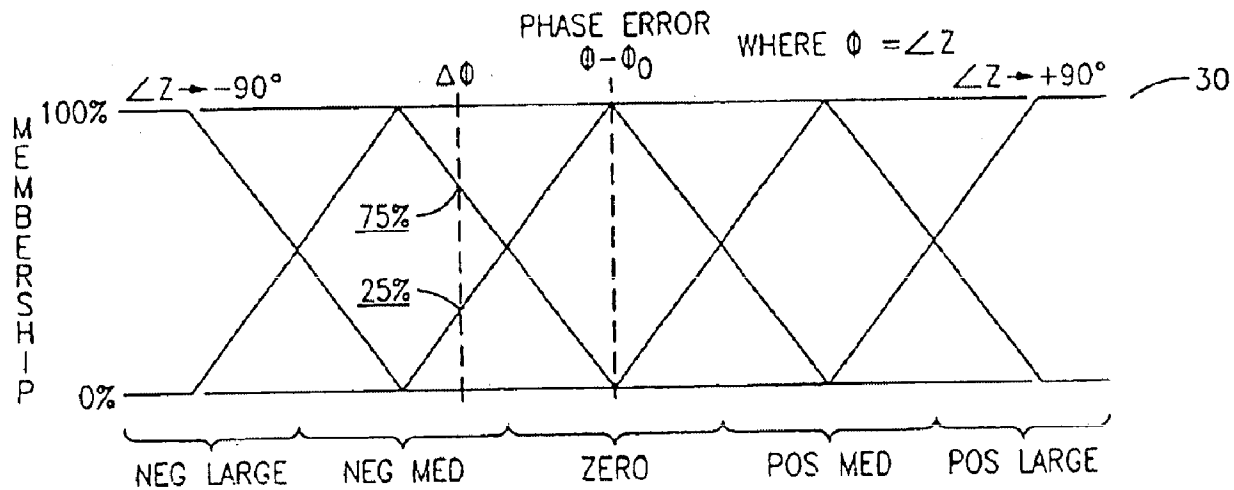

In the fuzzification stage 29, ramp-shaped membership functions, or fuzzy inference functions 32 and 30 are employed, as shown in FIGS. 3 and 4, respectively for the impedance magnitude error $\Delta Z$, and for the phase error $\Delta\phi$. These are overlapping functions, as shown, so that the respective error signal values are partly members of one fuzzy set and also partly members of an overlapping fuzzy set. In the example shown here in FIG. 3, the magnitude error $\Delta Z$ is of a positive value, and has a membership of 35% of zero error, and 65% positive medium error. At the same time, as shown in FIG. 4, the phase error $\Delta\phi$ has a negative value, and enjoys a 25% membership in the zero error fuzzy set and a 75% membership in the negative medium fuzzy set. These membership values are used for weighting and combining the respective drive signal values that are obtained according to the fuzzy rules application stage 35.

In the defuzzification stage 37, a weighting factor is applied to the drive signal values that are obtained, based on the conditions of magnitude error positive medium, phase error negative medium; magnitude error positive medium, phase error zero; magnitude error zero, phase error negative medium; and magnitude error zero, phase error zero (for the example in FIGS. 3 and 4). These are weighted according to their respective membership values, and are combined for each drive signal CS1, CS2, CS3, etc. This results in bringing each of the tuning devices quickly to a tuned condition, and accounts for the effect of each device on the phase error and magnitude error signals. The amount of movement for each tuning device also depends on the size and sign (positive or negative) of the phase and magnitude error. Thus, this system avoided the major pitfalls of prior art impedance match networks, as mentioned previously.

FIGS. 5A and 5B are matrices of typical fuzzy logic rules for a given impedance match network. Here, the notation used in the grid squares indicates the size and direction of motor current to be applied to the first tuning capacitor (FIG. 5A) and to be applied to the second tuning capacitor (FIG. 5B). These are PL—positive large; PM—positive medium; Ze—zero; NM—negative medium; and NL—negative large. The labels on the vertical and horizontal axes represent the fuzzy sets for the magnitude error and phase error, namely NL—negative large; NM—negative medium; Ze—zero; PM—positive medium; and PL—positive large. As is apparent, these matrices are somewhat asymmetric or unbalanced, as they have to account for the problems of non-linearity, cross-over, and lost conditions, as mentioned before. These matrices can be arrived at rather quickly by the process engineer, starting with orthogonal or symmetric matrices, where he drive current values depend on only one error signal. A pair of orthogonal matrices are shown in FIGS. 6A and 6B. Based on the engineer's experience and by making intuitive adjustments to the matrix, in particular at the conditions where cross-over and lost conditions may be likely to occur the process engineer can try modified rule sets against a synthetic load. By obtaining the results of the tuning algorithm the matrices can be changed incrementally, as need be, for each iteration. Within a reasonable number of trials, the process engineer will arrive at an optimal pair of rule set matrices, like those of FIGS. 5A and 5B.

The fuzzy logic tuning process of this invention achieves a good impedance match rapidly, without undue hunting and without encountering the problems noted above.

Figure 7:
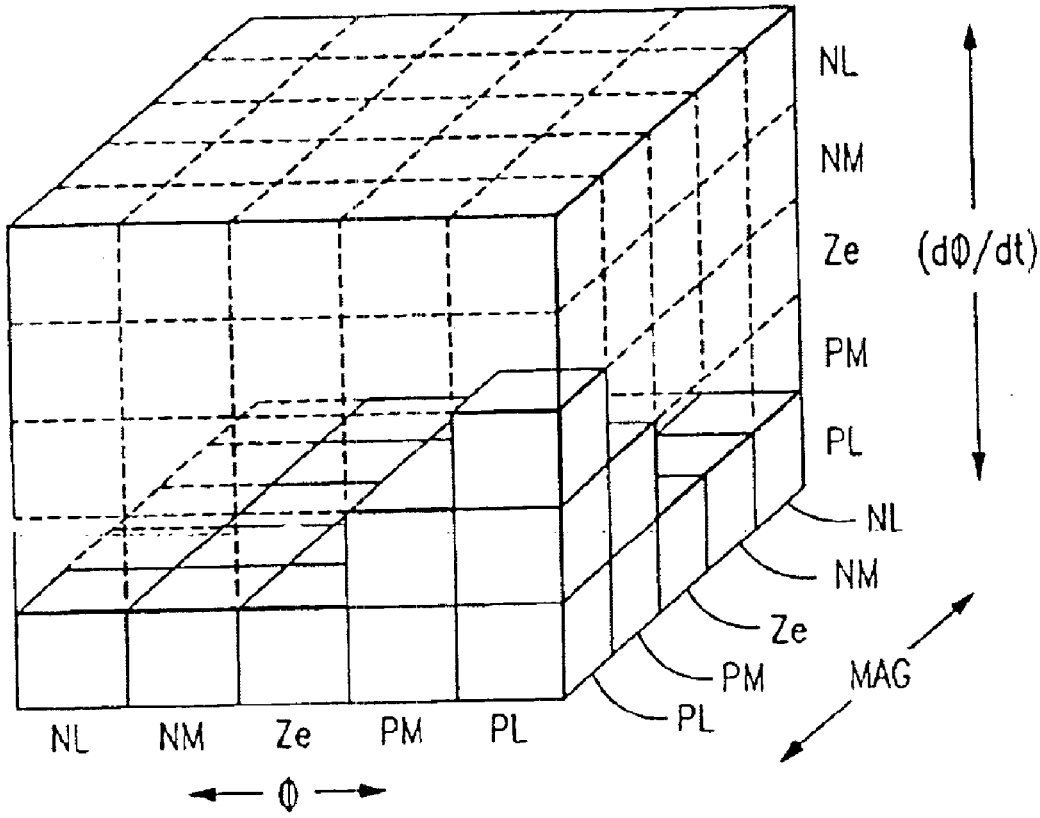
FIG. 7 illustrates a three-dimensional fuzzy logic rule application matrix that can be employed with additional embodiments of this invention.

It is also possible to employ rule sets of three, or more, variables to control the impedance match net in a more complex environment. For example, FIG. 7 illustrates a possible rules matrix showing error signal variables along its three axes, namely, magnitude error, phase error, and time rate of change of phase error. Of course, there are many other possibilities, and the number of input variables is not limited to only three. To account for the differences in error signal that vary with tuning element position, the rotor positions of the tuning capacitors C1, C2, and C3 can be included as inputs to the fuzzy logic controller. Also, rather than overlapping fuzzy sets, as shown here, it is possible that at least some of the fuzzy sets not overlap, or that the variables enjoy membership in three or more fuzzy sets.

While the invention has been described above in respect to an embodiment of the invention, it should be understood that the invention is not limited to that precise embodiment. Rather, many modifications and variations will present themselves to persons skilled in the art without departure from the scope and spirit of the invention, which is defined in the appended claims.

I claim:

1. Fuzzy logic method of tuning [an RF] *a radio frequency* (*RF*)matching network of the type having an input at which is applied RF power at a given frequency and at a given impedance, and an output which applies said power to an RF load having a non-constant impedance, said matching network including a phase-magnitude error detector means providing a phase error signal and a magnitude error signal related respectively to impedance phase angle error and impedance magnitude error, and said matching network comprising at least a first variable impedance *device* having a driven element for varying the impedance thereof and a second variable impedance *device* having a driven element for varying the impedance thereof; the method comprising:

supplying said phase and said magnitude error signals to a fuzzy logic controller, wherein each *of* said error [signal] *signals* has a magnitude and direction[,]*;* applying each *of* said *phase and magnitude* error [signal] *signals* to a fuzzy logic inference function based on a number of overlapping fuzzy sets, and where [the] *a* value of *each of said phase and magnitude* error [signal] *signals* enjoys membership in one or more fuzzy sets;

applying fuzzy logic rules to said phase and magnitude error signals according to [the] *said one or more* fuzzy sets for which said [first and second] *phase and magnitude* error signals enjoy membership;

obtaining drive signal values based on said fuzzy logic rules for each of said phase and magnitude error signals;

weighting said drive signal values according to the respective *one or more* fuzzy *sets* inference [functions] for which said *phase and magnitude* error signals enjoy membership; and combining said weighted drive signal values to produce an output drive signal for the *the driven element of* said first variable impedance device [driven element].

2. Fuzzy logic method of tuning an RF matching network according to claim 1, further comprising*:* obtaining *additional* drive signal values based on additional fuzzy logic rules for each of said [first and second] *phase and magnitude* error signals;

weighting said *additional* drive signal values according to additional respective fuzzy inference functions; and combining [such] *said* weighted *additional* drive signal values to produce an output drive signal for *the driven element of* said second variable impedance device [driven element].

3. Fuzzy logic method for tuning an RF matching network according to claim 2, wherein said fuzzy logic rules *and said additional fuzzy logic rules* comprise a matrix of N×M drive signal values, where N is the number of fuzzy sets of said phase error signal and M is the number of fuzzy sets of said magnitude error signal, and each *of said* drive signal [value] *values and said additional drive signal values* corresponds to a given set of said phase signal and a given set of said magnitude error signal.

4. Fuzzy logic method of tuning an RF matching network according to claim 1 *wherein* said *number of overlapping* fuzzy sets [being] *are* centered respectively about zero, a medium positive value, a medium negative value, a high positive value, and a high negative value.

5. A fuzzy logic controller for tuning [an RF] *a radio frequency* (*RF*)matching network, wherein said matching network is positioned between a source of applied RF power at a given frequency and at a given impedance, and an RF load having a non-constant impedance, said matching network including a phase-magnitude error detector means providing a phase error signal and a magnitude error signal related respectively to impedance phase angle error and impedance magnitude error, and said matching network comprising at least a first variable impedance *device* having a driven element for varying the impedance thereof and a second variable impedance *device* having a driven element for varying the impedance thereof; the fuzzy logic controller comprising*:*

*an* input means receiving values of said phase and magnitude error signals;

means for applying the values of said *phase and magnitude* error signals to a fuzzy logic inference function based on a number of overlapping fuzzy sets, and where a [the values] *value* of *each of said phase and magnitude* error signals enjoy membership in one or more fuzzy sets;

means for applying fuzzy logic rules to said phase and magnitude error signals according to fuzzy sets for which said error signals enjoy membership;

means for obtaining drive signal values according to said fuzzy logic rules for each [set] *of said fuzzy sets* for which said error signals enjoy membership;

means for weighting said drive signal values according to the respective fuzzy inference functions for the values of said *phase and magnitude* error signals; and means for combining said weighted drive signal values to produce an output drive signal for said first variable impedance device driven element.

6. Fuzzy logic controller according to claim 5, further comprising*:* means for obtaining additional drive signal values based on additional fuzzy logic rules for each of said phase and magnitude error signals;

means for weighting said additional drive signal values according to additional respective fuzzy inference functions; and means for combining [such] *said* weighted *additional* drive signal values to produce an output drive signal for said second variable impedance device driven element.

7. Fuzzy logic method of tuning a tunable [RF] *radio frequency* (*RF*)device of the type having an input at which is applied RF power at a given frequency and at a given impedance, and an output, including an error detector means providing a first error signal and a second error signal, and said tunable RF [means] *device* including at least a first variable impedance *device* having a driven element for varying the impedance thereof and a second variable impedance *device* having a driven element for varying the impedance thereof; the method comprising:

supplying said first and said second error signals to a fuzzy logic controller, wherein each *of* said *first and said second* error [signal] *signals* has a magnitude and direction[,]*:* applying each *of* said *first and said second* error [signal] *signals* to a fuzzy logic inference function based on a number of overlapping fuzzy sets, and generating a membership value that corresponds to [the] *an* amount of overlapping membership of the error [signal value] *signals* in one or more fuzzy sets;

applying *a plurality of* fuzzy logic rules to said first and second error signals according to the fuzzy sets for which said first and second error signals enjoy membership;

obtaining a plurality of drive signal values based on said *plurality of* fuzzy logic rules for each of said *first and second* error signals;

weighting said drive signal values according to the respective membership values for said first and second error signals; and combining said weighted drive signal values to produce an output drive signal for said first variable impedance having said first variable impedance device driven element.

8. Fuzzy logic method of tuning a tunable RF device according to claim 7, further comprising:

obtaining a plurality of additional drive signal values based on additional fuzzy logic rules for each of said first and second error signals;

weighting said additional drive signal values according to *a plurality of* additional respective fuzzy inference functions; and combining such weighted additional drive signal values to produce an output drive signal for said second variable impedance device driven element.

*9. An electrical network comprising:*

*a radio frequency (RF) generator for generating an RF signal, the RF generator having a source impedance;*

*a load receiving the RF signal, the RF signal providing a driving energy to the load, the load having a variable load impedance;*

*a matching network interposed between the RF generator and the load, the matching network having a variable network impedance, the matching network detecting at least one of an impedance phase and an impedance magnitude error and generating at least one of a respective phase error signal and a magnitude error signal, the matching network varying at least one of the impedance phase and the impedance magnitude error in order to vary the network impedance;*

*a fuzzy inference module receiving the at least one of the respective phase and magnitude error signals and defining a membership value that varies in accordance with membership in at least one fuzzy set; and*

*a controller receiving the at least one respective phase error signal and magnitude error signal, the controller applying fuzzy logic rules to the at least one of the respective impedance phase error signal and the impedance magnitude error signal according to the fuzzy sets for which said error signals enjoy membership in order to generate at least one control signal to vary the network impedance, thereby matching the source impedance and the load impedance.*

*10. The network of claim 9 wherein the controller further comprises a rules module having a set of rules applied in accordance with the membership value, the rules module generating at least one fuzzy output.*

*11. The network of claim 10, wherein the controller further comprises a defuzzification module, the defuzzification module converting the at least one fuzzy output to the at least one control signal.*

*12. The network of claim 9 wherein the matching network further comprises at least one of a variable capacitance and a variable inductance.*

*13. The network of claim 9, wherein the matching network further comprises a circuit for varying the network impedance.*

*14. The network of claim 9 wherein the load is a RF plasma chamber.*

*15. An electrical network comprising:*

*a radio frequency (RF) generator for generating an RF signal, the RF generator having a source impedance;*

*a load receiving the RF signal, the RF signal providing a driving energy to the load, the load having a variable load impedance;*

*a matching network interposed between the RF generator and the load, the matching network having a variable network impedance, the matching network detecting at least one network parameter and generating at least one sensed signal, the matching network varying the network impedance in order to match the variable load impedance and the source impedance, wherein the at least one sensed signal comprises at least one of an impedance phase error signal and an impedance magnitude error signal;*

*a fuzzy inference module receiving the at least one sensed signal and defining a membership value that varies in accordance with membership in at least one fuzzy set; and*

*a controller receiving the at least one sensed signal, the controller applying fuzzy logic rules to the at least one sensed signal according to the fuzzy sets for which said phase and magnitude error signals enjoy membership in order to generate at least one control signal to vary the network impedance, thereby matching the source impedance and the load impedance.*

*16. The network of claim 15 wherein the controller further comprises a rules module having a set of rules applied in accordance with the membership value, the rules module generating at least one fuzzy output.*

*17. The network of claim 15 wherein the controller further comprises a defuzzification module, the defuzzification module converting at least one fuzzy output to the at least one control signal.*

*18. The network of claim 15 wherein the matching network includes at least one of a variable capacitance and a variable inductance.*

*19. The network of claim 15 wherein the matching network further comprises a circuit for varying the network inductance.*

*20. The network of claim 15 wherein the matching network further comprise a circuit for varying the network impedance.*

*21. The network of claim 15, wherein the load is a RF plasma chamber.*

*22. A method of tuning a radio frequency (RF) impedance matching network having an input which receives RF power and an output which applies the power to a RF load, the matching network having a variable impedance, comprising the steps of:*

*determining an impedance phase error and an impedance magnitude error and generating a corresponding phase error signal and a corresponding magnitude error signal;*

*applying the impedance phase and impedance magnitude errors to a fuzzy logic inference function, the phase and magnitude error signals each having at least one respective membership value in at least one fuzzy set; and*

*applying fuzzy logic rules to the impedance phase and impedance magnitude error signals according to the fuzzy sets for which said error signals enjoy membership to generate fuzzy output signals based upon the phase and the magnitude error signals and generating a control signal to adjust the variable impedance of the matching network.*

*23. The method of claim 22 wherein the step of applying fuzzy logic further comprises applying logic rules to the at least one respective membership value to generate at least one respective fuzzy output value.*

*24. The method of claim 22, wherein the step of applying logic rules further comprises the step of weighting at least one respective fuzzy output value according to the at least one respective membership value.*

*25. The method of claim 24 wherein the step of applying logic rules further comprises the step of combining said weighted at least one respective fuzzy output values to produce the control signal.*

*26. The method of claim 22, wherein the logic rules comprise a matrix of N×M fuzzy output values, where N is the number of fuzzy sets of a first sensed signal and M is the number of fuzzy sets of a second sensed signal, and each fuzzy output value corresponds to a predetermined set of the first sensed signal and a predetermined set of the second sensed signal.*

*27. The method of claim 22 wherein the at least one fuzzy set comprises a plurality of fuzzy sets centered respectively about zero, a medium positive value, a medium negative value, a high positive value, and a high negative value.*

*28. A method of tuning a radio frequency (RF) impedance matching network having an input which receives RF power and an output which applies the power to a RF load, the matching network having a variable impedance, comprising the steps of:*

*determining a network parameter and generating a corresponding sensed signal that varies in accordance with the network parameter;*

*applying the corresponding sensed signal to a fuzzy logic inference function, the corresponding sensed signal having at least one respective membership value in at least one fuzzy set; and*

*applying fuzzy logic rules to the corresponding sensed signal according to fuzzy sets for which said sensed signal enjoys membership;*

*generating fuzzy output signals based upon the corresponding sensed signal; and*

*generating a control signal to adjust the variable impedance of the matching network based upon the fuzzy output signals.*

*29. The method of claim 28 wherein the step of applying fuzzy logic rules further comprises applying logic rules to the at least one respective membership value to generate at least one respective fuzzy output value.*

*30. The method of claim 28, wherein the step of applying fuzzy logic rules further comprises the step of weighting at least one respective fuzzy output value according to the at least one respective membership value.*

*31. The method of claim 30 wherein the step of applying fuzzy logic rules further comprises the step of combining said weighted at least one respective fuzzy output value to produce the control signal.*

*32. The method of claim 28, wherein the fuzzy logic rules comprise a matrix of N×M fuzzy output values, where N is the number of fuzzy sets of the corresponding sensed signal and M is the number of fuzzy sets of a second sensed signal, and each fuzzy output value corresponds to a predetermined set of the sensed signal and a predetermined set of the second sensed signal.*

*33. The method of claim 28 wherein the at least one fuzzy set comprises a plurality of fuzzy sets centered respectively about zero, a medium positive value, a medium negative value, a high positive value, and a high negative value.*

* * * * *